United States Patent
Kirai et al.

(10) Patent No.: US 9,099,620 B2
(45) Date of Patent: Aug. 4, 2015

(54) LIGHT-EMITTING DEVICE AND METHOD FOR MANUFACTURING THE SAME

(71) Applicant: STANLEY ELECTRIC CO., LTD., Meguro-ku, Tokyo (JP)

(72) Inventors: Shogo Kirai, Kanagawa (JP); Hironobu Sakamoto, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/222,415

(22) Filed: Mar. 21, 2014

(65) Prior Publication Data

US 2014/0284644 A1     Sep. 25, 2014

(30) Foreign Application Priority Data

Mar. 22, 2013   (JP) .................. 2013-060450

(51) Int. Cl.
| | |
|---|---|
| H01L 29/22 | (2006.01) |
| H01L 29/24 | (2006.01) |
| H01L 33/50 | (2010.01) |

(52) U.S. Cl.
CPC ....... *H01L 33/508* (2013.01); *H01L 2933/0041* (2013.01)

(58) Field of Classification Search
CPC ................ H01L 33/502; H01L 33/508; H01L 2251/5376; H01L 2933/0041
USPC ................................... 257/98, 100
See application file for complete search history.

(56) References Cited

U.S. PATENT DOCUMENTS

| | | | | |
|---|---|---|---|---|
| 8,847,261 | B1 * | 9/2014 | Ashdown et al. | 257/98 |
| 8,933,478 | B2 * | 1/2015 | Tischler et al. | 257/98 |
| 2012/0068209 | A1 * | 3/2012 | Andrews | 257/98 |

FOREIGN PATENT DOCUMENTS

| | | |
|---|---|---|
| JP | 2003-243727 A | 8/2003 |
| JP | 2004-088013 A | 3/2004 |

* cited by examiner

*Primary Examiner* — Hung Vu
(74) *Attorney, Agent, or Firm* — Holtz, Holtz, Goodman & Chick PC

(57) ABSTRACT

The present invention is directed to reduction of angle dependence of chromaticity in a phosphor layer, without using a light scattering agent, the phosphor layer being made up of phosphor particles adhered tightly to one another via a binder according to the spray coating method. The phosphor layer contains phosphor particles laid along the top surface of the light emitting element and the binder embedded into a gap between the phosphor particles, and the phosphor layer does not contain the light scattering agent. The area of a region on the upper surface of the phosphor layer is between or equal to 3% and 10% with respect to the area of the top surface of the light emitting element, the region being positioned at the gap between the phosphor particles and allowing the light being outputted to pass through the binder and directly reach the upper surface of the phosphor layer. This configuration makes the asperities smaller on the surface of the phosphor layer and reduces the angular dependence of chromaticity.

5 Claims, 14 Drawing Sheets

LIGHT-EMITTING DEVICE AND METHOD FOR MANUFACTURING THE SAME

FIELD OF THE INVENTION

The present invention relates to a light emitting device in which a part of light from a light emitting element is subjected to wavelength conversion by a phosphor and mixed with the light from the light emitting element, and the mixed light is outputted.

DESCRIPTION OF THE RELATED ART

Conventionally, there is known a light emitting device in which a phosphor layer is formed by coating or filling the top surface of a light emitting element with an uncured resin where a phosphor is dispersed, and the resin is cured to form the phosphor layer. The phosphor layer converts a part of the light outputted from the light emitting element into fluorescence, and mixes the fluorescence with the light not subjected to wavelength conversion, allowing the light being obtained to be outputted.

In the phosphor layer as described above, if the ratio of the phosphor is made higher, the ratio of the resin becomes lower and binding of phosphor particles is not sufficiently strong. On the other hand, if the ratio of the phosphor is made lower, there is a problem that efficiency is down in converting into the fluorescence. There is another problem that the resin is more likely to be degraded or discolored.

In order to solve the aforementioned problems, the Japanese unexamined patent application publication No. 2003-243727 (hereinafter, referred to as the "patent document 1") discloses a structure where the light emitting element is covered with a coating layer in which phosphor particles from 3 μm to 10 μm in an average particle diameter are tightly adhered to one another, via fine particles (binder) containing oxide and hydroxide as major ingredients. The phosphor particles and the binder are adhered to the top surface of the light emitting element according to a spray coating method. The patent document 1 also discloses that the fine particles serving as the binder is mixed with fine particles of diffusing agent.

The Japanese unexamined patent application publication No. 2004-88013 (hereinafter, referred to as the "patent document 2") discloses that a coating layer is formed by the spray coating method, the coating layer containing phosphor particles in the range from 0.1 μm to 15 μm in the average particle diameter being bound to the top surface of the light emitting element via inorganic oxide such as $SiO_2$, and further a void in the coating layer is impregnated with inorganic oxide and hydroxide, so that the void is embedded with them.

DESCRIPTION OF THE RELATED ART

As described in the patent documents 1 and 2, by using the spray coating method, it is possible to form the phosphor layer on the top surface of the light emitting element, the phosphor layer having a structure in which phosphor particles are tightly adhered to one another via fine particles serving as a binder. This phosphor layer has an advantage that the content ratio of the phosphor is high, achieving high efficiency in converting into the fluorescence. FIG. 2 in the patent document 1, and FIG. 2 and FIG. 3 in the patent document 2 schematically illustrate a layer in which the phosphor particles are laid evenly. In fact, however, due to uneven coating from a nozzle upon spray coating, surface asperities become large as shown in the photo of FIG. 6 in the patent document 2. This is because a part where the phosphor particles are raised high in the film thickness direction, and a part where the height of the phosphor particles are low are generated.

Therefore, as shown in FIG. 1 in the accompanying drawings, the light outputted from the light emitting element in the front direction passes through the phosphor only by the thickness of the phosphor, whereas the light outputted from the light emitting element in an oblique direction, passes through the phosphor in the part highly raised, and therefore this increases the amount of the phosphor to pass through. Accordingly, there occurs a problem that, as shown in the graph of FIG. 2 in the accompanying drawings, chromaticity largely depends on the angle.

As described in the patent documents 1 and 2, the angular dependence of chromaticity may be reduced, by adding a light scattering agent to the fine particles serving as the binder. However, the light that shines on the light scattering agent may cause not only forward scattering but also rearward scattering. Therefore, the light outputted from the phosphor layer is reduced, resulting in that the brightness is lowered. If the light scattering agent is positioned between the phosphor and the light emitting element, this may hamper direct heat transfer from the phosphor to the light emitting element, and the heat hardly goes down in the phosphor layer, resulting in that brightness is degraded.

An object of the present invention is to reduce the angular dependence of chromaticity in the phosphor layer that is formed by tightly adhering the phosphor particles to one another via the binder according to the spray coating.

SUMMARY OF THE INVENTION

In order to achieve the aforementioned object, the light emitting device of the present invention includes a light emitting element and a phosphor layer placed on the top surface of the light emitting element, converts a part of light emitted from the top surface of the light emitting element into fluorescence by the phosphor layer, and mixes the light passing through the phosphor layer with the fluorescence, so as to output light with predetermined chromaticity. The phosphor layer contains phosphor particles being laid along the top surface of the light emitting element and a binder filled (embedded) into a gap between the phosphor particles. The area of a region being positioned at the gap between the phosphor particles is between or equal to 3% and 10% with respect to the area of the upper surface of the phosphor layer, the region allowing the light being outputted to pass through the binder and directly reach the upper surface of the phosphor layer.

The present invention controls the area of the region (the area for forming a light leak) that allows the light to pass through the binder and directly reach the upper surface of the phosphor layer, via the gap between the phosphor particles, in the light outputted from the upper surface of the phosphor layer, thereby controlling the state of the particles in the phosphor layer and reducing the angular dependence of chromaticity in the phosphor layer.

DESCRIPTION OF THE PREFERRED EMBODIMENT

Figure 1:
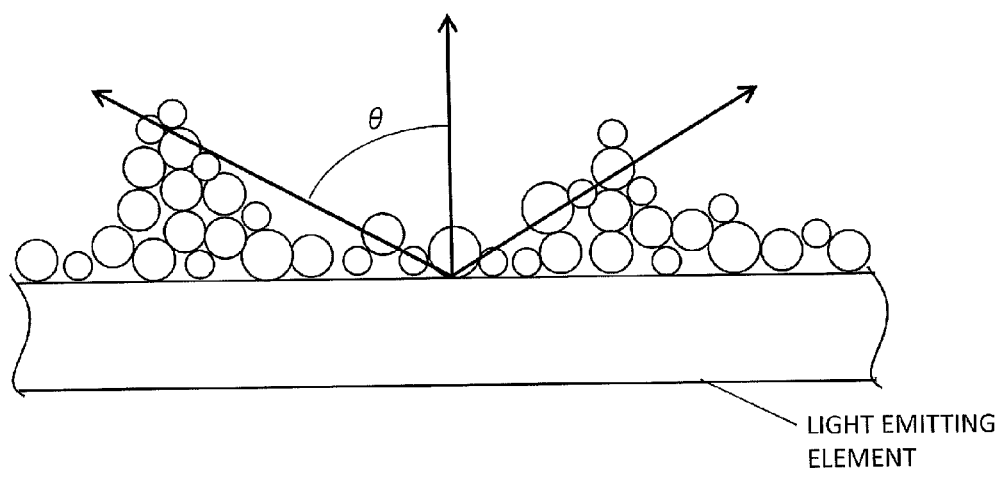
FIG. 1 illustrates surface asperities of phosphor particles in the phosphor layer that is formed according to a conventional spray coating method.
Figure 2:
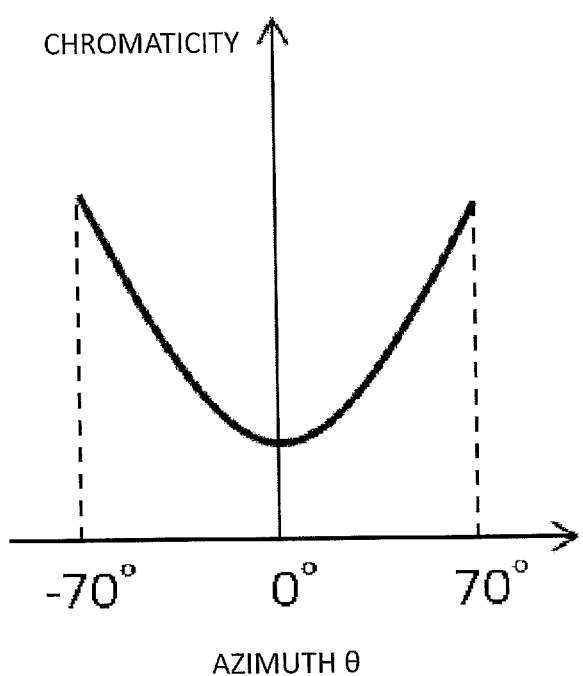
FIG. 2 is a graph showing angular dependence of chromaticity in the phosphor layer that is illustrated in FIG. 1.
Figure 3A:
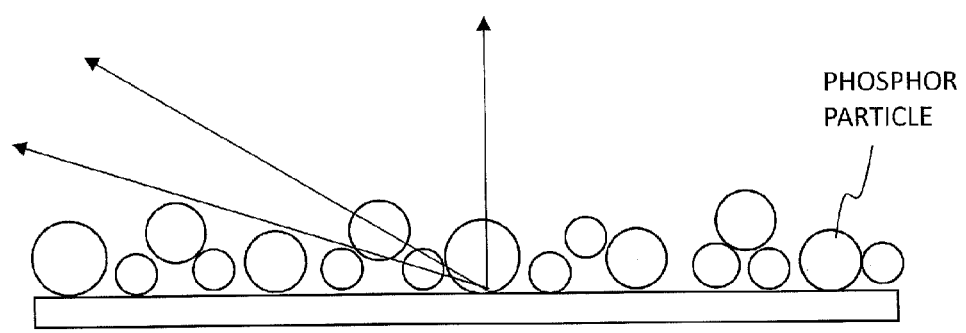
FIG. 3A illustrates the state of the phosphor layer in which the phosphor particles are laid thinly and evenly on the top surface of the light emitting element.
Figure 3B:
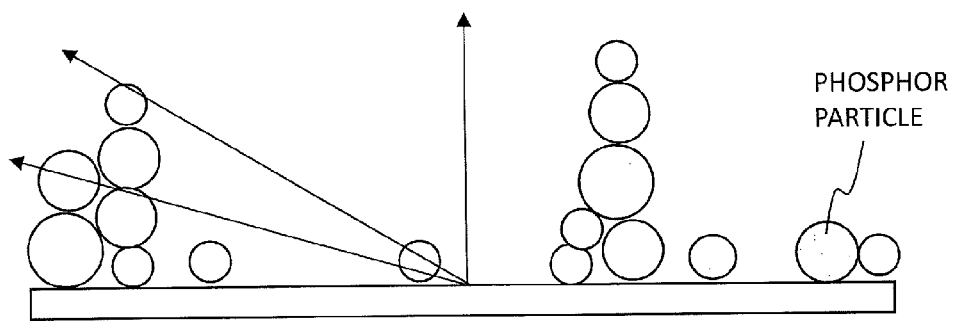
FIG. 3B illustrates the state of the phosphor layer in which the phosphor particles are locally accumulated on the top surface of the light emitting element.

Firstly, the principle of the present invention will be explained. In the light emitting device of the present invention, a phosphor layer is placed on a top surface of the light emitting element that emits light having a predetermined wavelength, and this phosphor layer converts a part of the light emitted from the light emitting element into fluorescence, and mixes the fluorescence with the light emitted from light emitting element, thereby outputting the mixed light. In the light emitting device as described above, desired chromaticity (e.g., a range of white color based on the SAE standard) of the outputted light determines a necessary amount of the phosphor. On this occasion, if there are large asperities on the surface of the phosphor layer, the angular dependence of the chromaticity becomes larger as shown in FIG. 1 and FIG. 2. On the other hand, if there are small asperities on the surface of the phosphor layer, the angular dependence of the chromaticity becomes smaller. By way of example, as shown in FIGS. 3A and 3B, it is assumed that the same number of phosphor particles are laid on the top surface of the light emitting element. In this case, as shown in FIG. 3A, if the phosphor particles are laid thinly and flatly on the top surface of the light emitting element, there is not a significant difference in the amount of the phosphor through which the outputted light passes through, between the outputted light in the front direction and the outputted light at a large azimuth angle θ. On the other hand, as shown in FIG. 3B, if the phosphor particles are locally accumulated and there are large asperities on the surface, the outputted light at a large azimuth angle abuts against the phosphor particles in the convex portion being raised. Therefore, the amount of the phosphor to pass through is significantly different from that of the outputted light in the front direction, and this increases the angular dependence of the chromaticity.

When the phosphor layer is formed by the spray coating method, it is possible to control the state of adherence of the phosphor particles in the phosphor layer, according to a coating condition thereof. However, it has been difficult to represent by a numerical value, the state of the phosphor particles in the formed phosphor layer, i.e., what state the phosphor particles come into. Through the extensive research, the inventors have found the following; in the case where the phosphor layer is mounted on the light emitting element, it is possible to represent the state of the phosphor particles, by the area ratio of a region to the top surface of the light emitting element, the region allowing the outputted light to pass through a gap between the phosphor particles and reach the upper surface of the phosphor layer (the region for generating light leak). It has also been found that when the phosphor layer is mounted on a transparent plate-like member, a value of the diffuse transmittance, and the like, of the member may represent the state of the particles in the phosphor layer.

Figure 4:
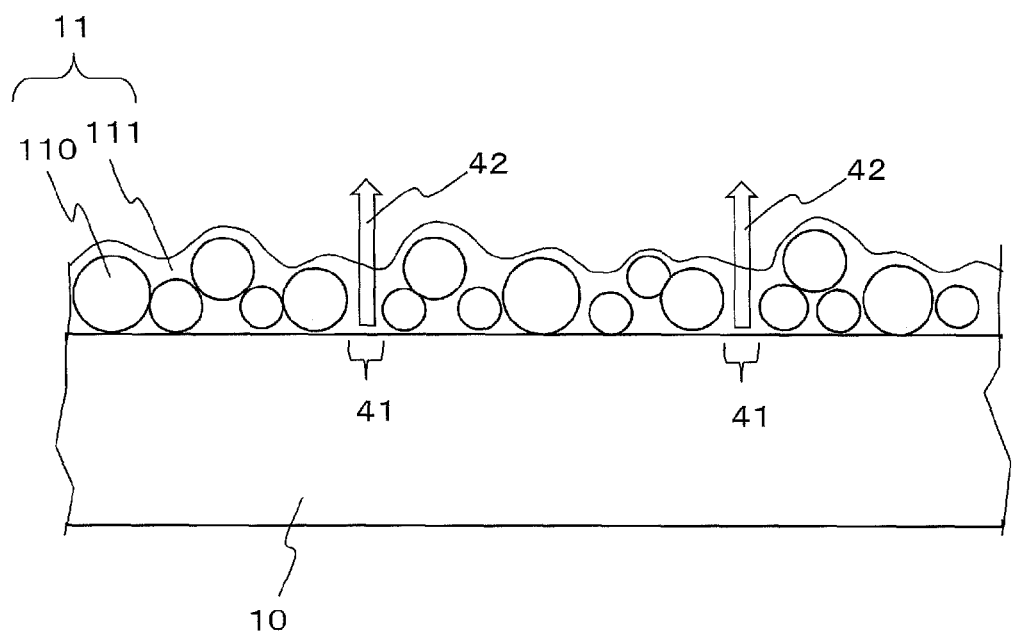
FIG. 4 illustrates the state of the phosphor particles and a binder in the phosphor layer and a region 41 where a light leak 42 occurs according to one embodiment.

Specifically, as shown in FIG. 4, the area of the region 41 on the upper surface of the phosphor layer 11 is controlled to be between or equal to 3% and 10% with respect to the area of the top surface of the light emitting element 10, the region 41 being positioned at a gap between the phosphor particles 110 and allowing the outputted light 42 to pass through the binder 111 and directly reach the upper surface of phosphor layer 11 (the region for generating a light leak). It is to be noted here that the area of the top surface of the light emitting element 10 is identical to the area of the upper surface of the phosphor layer 11. The area of the region 41 is configured to be equal to or less than 10%, thereby obtaining small asperities on the phosphor layer 11 and reducing the angular dependence of the chromaticity. In addition, the area of the region 41 is configured to be equal to or more than 3%, thereby mixing the light from the light emitting element 10 and the fluorescence of the phosphor particle 110, and allowing desired chromaticity to be obtained.

The area of the region 41 configured to be between or equal to 3% and 9%, is more preferable, since the angular dependence of the chromaticity may be reduced significantly. The area of the region 41 configured to be between or equal to 3% and 8%, is particularly preferable, since the angular dependence of the chromaticity may be reduced considerably, and further, even when the ratio of the area of the region 41 is changed, the angular dependence of the chromaticity is small in change and stable, facilitating volume production.

Figure 5A:
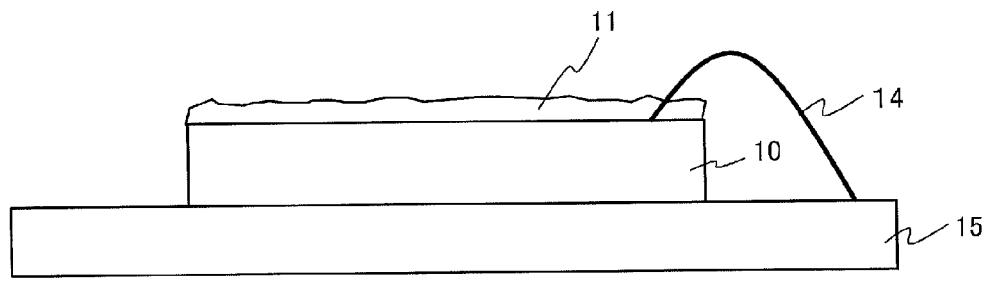
FIG. 5A to FIG. 5C each illustrates a cross section showing a configuration of the light emitting device according to one embodiment.

As shown in FIG. 5A, the light emitting device of the present invention is configured in such a manner that the phosphor layer 11 is placed on the top surface of the light emitting element 10. As shown in FIG. 4, the phosphor layer 11 includes the phosphor particles 110 laid along the top surface of the light emitting element 10, and the binder 111 filling (embedding) a gap between the phosphor particle 110 and the phosphor particle 110. The phosphor particles 110 are excited by the light from the light emitting element 10, and emits fluorescence. The binder 111 is transparent to the outputted light from the light emitting element 10 and the fluorescence of the phosphor particles 110. A light scattering agent may be or may not be contained in the phosphor layer 11. If the phosphor layer 11 contains a light scattering agent, a part of the light incident on the phosphor layer 11 from the light emitting element 10 may be subjected to back scattering, and brightness on the upper surface of the phosphor layer 11 may be lowered. Therefore, it is more preferable that light scattering agent is not contained.

Preferably, the surface roughness Ra of the phosphor layer 11 is equal to or less than an average particle diameter of the phosphor particle 110, and more preferably, it is equal to or less than a half of the average particle diameter of the phosphor particle 110. This is because if the surface roughness is large as described above, the angular dependence of the chromaticity becomes larger.

It is preferable that the film thickness of the phosphor layer 11 is equal to or less than threefold of the average particle diameter of the phosphor particle 110. This is because if the film becomes thicker than this, the phosphor particles 110 overlap one another, covering the entire top surface of the light emitting element 10, and this makes it hard to generate the region 41 for the light leak. In addition, there is a tendency to increase the asperities on the upper surface of the phosphor layer 11.

It is preferable that the average particle diameter of the phosphor particle 110 is between or equal to 10 µm and 20 µm. This is because the larger is the diameter of the phosphor particle, the higher is the excitation efficiency, and the efficiency becomes stable when the particle diameter is equal to or more than 10 µm. It is particularly preferable if the diameter of the phosphor particle is between or equal to 10 µm and 16 µm.

Figure 5B:
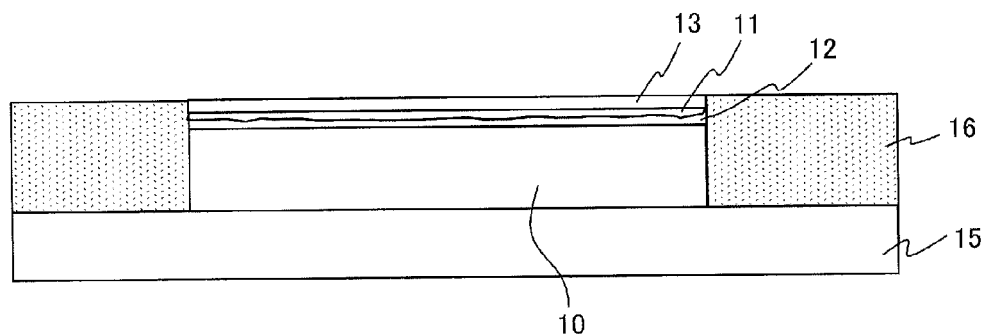
Figure 5C:
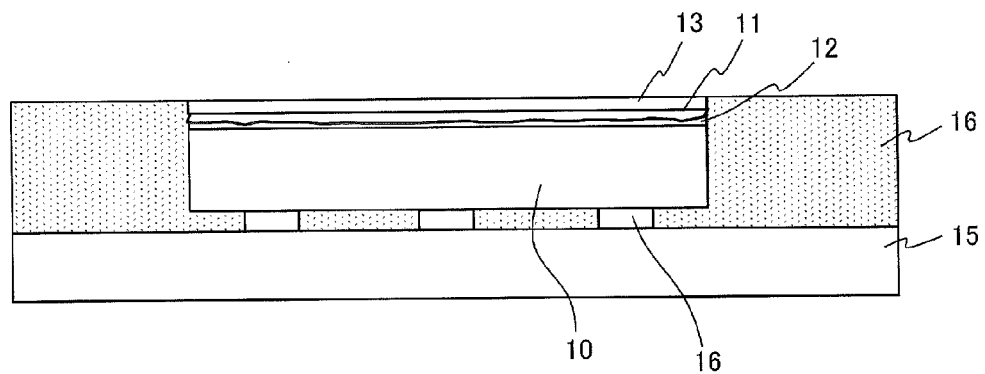

As shown in FIGS. 5B and 5C, it is also possible to configure in such a manner that an adhesion layer 12 is placed between the phosphor layer 11 and the top surface of the light emitting element 10, and a transparent plate-like member 13 is placed on the upper surface of the phosphor layer 11. As the transparent plate-like member 13, a member such as glass or quartz may be employed, for instance, the member being transparent to the light outputted from the light emitting element 10 and the fluorescence of the phosphor particle 110. Alkali-free glass with low reactivity is more preferable. The configuration as illustrated in FIG. 5B and FIG. 5C allows a production according to the following procedure; the phosphor layer 11 is formed on the plate-like member 13 in advance, the plate-like member 13 is mounted on the light emitting element 10, with the phosphor layer 11 facing the top surface of the light emitting element 10, and fixed via the adhesion layer 12.

As a structure of the light emitting element 10 in the device configuration of FIG. 5A and FIG. 5B, an element provided with a luminous layer (epitaxial layer) on the phosphor layer 11 is used preferably. Power feeding to the luminous layer may be performed, for example, via a bonding wire 14 connected to the top surface of the light emitting element 10 and an electrode provided on the bonding face of the light emitting element 10 with the package substrate 15 (so called, vertical-conducting type light emitting element).

As shown in FIG. 5C, it is also possible to employ a flip-chip type light emitting element 10 in which power feeding is performed via a bump 116 placed between the light emitting element 10 and the package substrate 15.

Further as shown in FIG. 5B and FIG. 5C, a light reflecting member (a white resin, for instance) 16 covers the sides of the light emitting element 10, the adhesion layer 12, the phosphor layer 11, and the transparent plate-like member 13, thereby preventing side emission and enhancing the brightness on the upper surface.

A method for producing the light emitting device as shown in FIG. 5A will be explained. Firstly, a solvent is added as appropriate to the mixture of the phosphor particles 110 and the binding agent so as to adjust the concentration, and this liquid is sprayed on the top surface of the light emitting element according to the spray coating method, thereby forming the phosphor layer 11. Thereafter, the binding agent is immobilized by heating or the like, allowing the phosphor particles 110 to be tightly adhered to one another. If necessary, the binder may further be sprayed on thus formed phosphor layer 11, so as to impregnate the gap between the phosphor particles 110 with the binder.

In the step of forming the phosphor layer 11, another phosphor layer is formed on a transparent plate-like member under the same condition as the condition for spraying onto the light emitting element 10, and the spraying condition is adjusted so that the phosphor layer on the transparent plate-like member has the diffuse transmittance of 53% or more. The phosphor layer 11 is formed on the top surface of the light emitting element 10, under the spraying condition after this adjustment.

According to the studies by the inventors, it is confirmed that the state of the phosphor particles in the phosphor layer 11 where the ratio of the region 41 causing the light leak is 10% or less, corresponds to the state of the phosphor particles in the phosphor layer that is formed on the transparent plate-like member (e.g., glass plate) under the same condition, and the diffuse transmittance thereof is 53% or more. Therefore, the spraying condition of the spray coating is adjusted based on the diffuse transmittance of the phosphor layer formed on the transparent plate-like member, thereby facilitating the setting of the condition.

Implementing the light emitting element 10 on the package substrate 15 may be performed, before or after the step of forming the aforementioned phosphor layer 11. It is also possible to perform bonding of the wire 14 prior to the step of forming the phosphor layer 11 and then the spray coating is performed on the wire 14. Alternatively, only a part associated with a bonding pad is removed from the phosphor layer 11 being formed, and then, bonding of the wire 14 may be performed thereto.

According to the studies by the inventors, it is confirmed that not only the diffuse transmittance, but also each of the following conditions corresponds to the state that the ratio of the region 41 is 10% or less with respect to the light emitting element 10, for causing the light leak from the phosphor layer 11; i.e., the conditions of the phosphor layer formed on the transparent plate-like member, including that a parallel light transmittance is 10% or less, a value obtained by subtracting the parallel light transmittance from the diffuse transmittance is 47% or more, the total light transmittance is 62% or more, and the haze value is 84% or more. Therefore, the spray condition may be adjusted so that at least one of those conditions is satisfied.

Next, a method for producing the light emitting device as shown in FIG. 5B and FIG. 5C will be explained. Firstly, a solvent is added as appropriate to the mixture of the phosphor particles 110 and the binding agent, so as to adjust the concentration. This is sprayed on the top surface of the transparent plate-like member 13 according to the spray coating method, and then the phosphor layer 11 is formed. Thereafter, the binding agent is immobilized by heating or the like, allowing the phosphor particles 110 to be tightly adhered to one another. On this occasion, the diffuse transmittance of the phosphor layer 11 on the transparent plate-like member 13 is measured, and the spraying condition of the spray coating is adjusted so that the diffuse transmittance becomes 53% or more.

Thereafter, if necessary, the binder may further be sprayed on thus formed phosphor layer 11, so as to impregnate the gap between the phosphor particles 110 with the binder. It is further possible to perform impregnation of the phosphor and bonding of the element simultaneously by the adhesion layer 12, without using the binder.

The transparent plate-like member 13 is mounted on the light emitting element 10 in such a manner that the phosphor layer 11 on the transparent plate-like member 13 faces the top surface of the light emitting element 10, being fixed via the adhesion layer 12. This allows the phosphor layer 11 with the diffuse transmittance of 53% or more to be fixed on the light emitting element 10.

In the step before or after the aforementioned step, the light emitting element 10 is implemented on the package substrate 15, and bonding of the wire 14 is performed as appropriate, thereby producing the light emitting device as shown in FIGS. 5B and 5C.

In the production method as described above, instead of the diffuse transmittance, it is further possible to adjust the spraying condition so that the phosphor layer formed on the transparent plate-like member satisfies at least one of the following conditions; the parallel light transmittance is 10% or less, a value obtained by subtracting the parallel light transmittance from the diffuse transmittance is 47% or more, the total light transmittance is 62% or more, and the haze value is 84% or more.

Another method for producing the light emitting device as shown in FIG. 5B and FIG. 5C will be explained in the following. The step of forming the phosphor layer is similar to the aforementioned production method. However, the method here measures the diffuse transmittance of the phosphor layer 11 formed on the transparent plate-like member 13, the phosphor layer having the diffuse transmittance of 53% or more is selected, and the subsequent step is performed by using only the selected phosphor layer. Then, the transparent plate-like member 13 is mounted on the light emitting element 10 in such a manner that the selected phosphor layer 11 faces the top surface of the light emitting element 10. Accordingly, it is possible to produce the light emitting device using only the phosphor layer 11 with the diffuse transmittance of 53% or more by actual measurement, and this may enhance yield.

Also in this production method, instead of the diffuse transmittance, it is possible to select a phosphor layer formed on the transparent plate-like member, satisfying at least one of the following conditions; the parallel light transmittance is 10% or less, a value obtained by subtracting the parallel light transmittance from the diffuse transmittance is 42% or more, the total light transmittance is 62% or more, and the haze value is 84% or more.

The light emitting device of the present invention may be utilized preferably as a vehicle-use headlamp or a light source for illumination.

In addition, not only an LED (light emitting diode) but also an LD (laser diode) may be employed as the light emitting element 10.

EXAMPLES

First Example

As the first example, multiple samples were prepared, each forming the phosphor layer 11 on a glass plate according to the spray coating method.

The phosphor particle 110 being used was a YAG phosphor that excites yellow light by blue light and has the average particle diameter of 15 μm. As a material of the binding agent, a material of glass binder, i.e., an inorganic glass compound (ethyl silicate compound) was used. Those materials were dispersed and mixed so that the concentration of the phosphor particles was 50 wt %, the ethyl silicate compound was 3%, and a residue was an organic solvent. Then, spray liquid containing the phosphor was prepared. The viscosity of the spray liquid containing the phosphor was 100 mPa·s. The concentration of the phosphor may also fall into the range from 10 wt % to 80 wt %. The viscosity in the range from 20 mPa·s to 500 mPa·s may be allowable as the viscosity of the spray liquid containing the phosphor.

In addition, dispersion and mixing were performed so that the concentration of the ethyl silicate compound was 10% and the residue was the organic solvent, and the binder spray liquid was prepared. As the material of the binder, it is possible to employ a resin system (dimethyl silicone or phenyl silicone) being adjusted by the organic solvent so that the viscosity becomes low, or a mixture obtained by mixing one or more types of the resin system. As the solvent, the organic solvent being volatile was used, such as an alcohol system (or xylene, and the like). It is alternatively possible that appropriate doses of the resin system binder may be discharged via a dispenser, without adjusting the viscosity thereof, the phosphor particles are impregnated with the resin system binder at a temperature achieving a low viscosity, and thereafter, real curing is performed to form the phosphor layer 11.

Figure 6A:
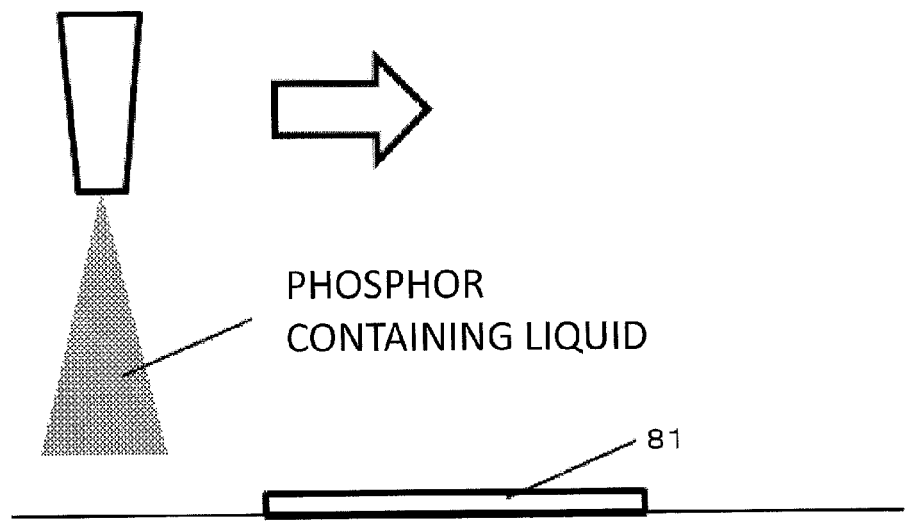
FIG. 6A and FIG. 6B illustrate steps for forming the phosphor layer 11 of the first example.

Next, as illustrated in FIG. 6A, the spray liquid containing the phosphor was sprayed and coated on the glass plate 81 being larger than a topside shape of the LED element, according to the spray coating method, and thereafter, it was dried. With the procedure above, a phosphor layer was formed, containing the phosphor particles 110 being adhered tightly via the binding agent. On this occasion, the spraying condition was controlled so that the amount of the phosphor particles coated on the glass plate became a certain amount necessary for obtaining a predetermined chromaticity.

Figure 7:
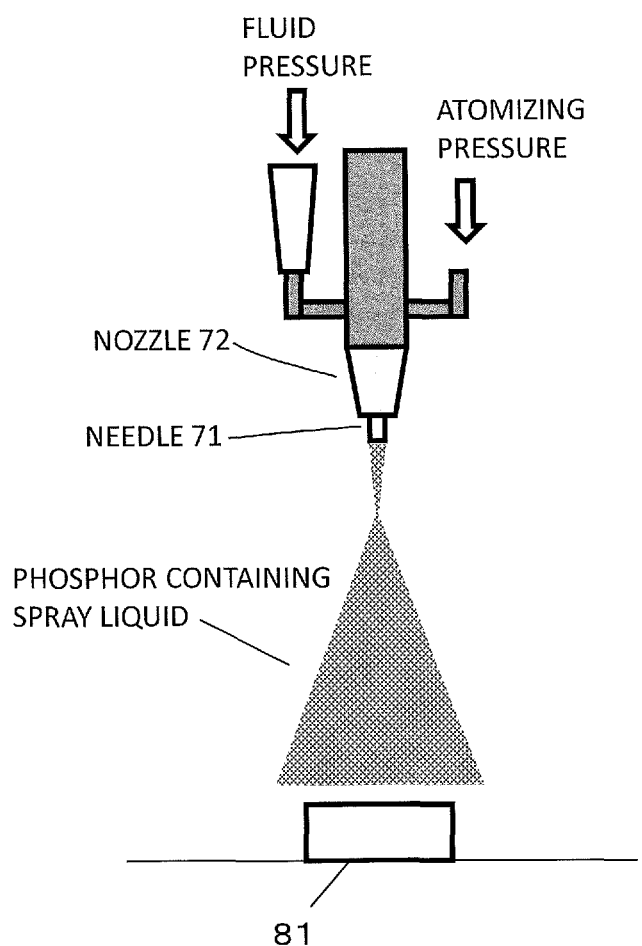
FIG. 7 illustrates a configuration of a spray unit used in the first example.

FIG. 7 illustrates the spray unit used for the aforementioned spray coating and the spraying method. Any type of the spray unit is available, as far as it is possible to perform coating of the phosphor particles with a homogeneous distribution. The discharging part of the spray unit described in this example is provided with a needle 71 and an atomizing nozzle 72 for discharging the spray liquid, and the needle 71 is located substantially at the center of the opening of the nozzle 72. Gas for atomization is sprayed from the nozzle 72. On this occasion, the nozzle 72 is configured to spray the gas toward the liquid discharged from the needle 71. Therefore, the gas atomized with the spray liquid is once concentrated as shown in FIG. 7, enabling spraying of minute size and minute trace. Therefore, the unit having the structure as illustrated in FIG. 7 is allowed to control the usage of the spray liquid containing the phosphor to be around 1/100 of the amount that is necessary for a general spray unit. In addition, it is possible to spray the phosphor particles 110 in a minute size and perform coating with a homogeneous distribution. Furthermore, the phosphor particles are not scattered around and used without wasting for forming the phosphor layer 11, and this may reduce the cost.

Figure 6B:
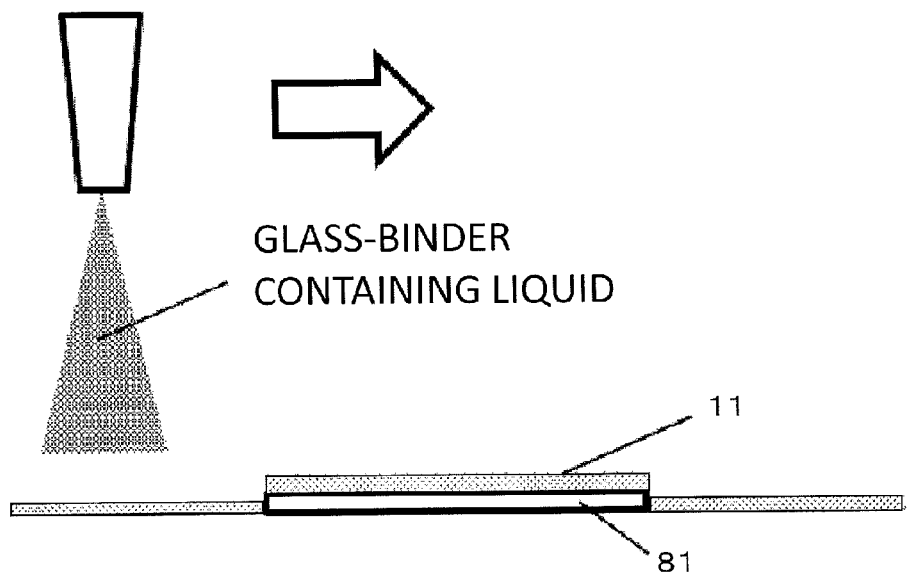

In the subsequent step, as illustrated in FIG. 6B, the binder spraying liquid was sprayed and coating was performed by the spray unit as described above, until covering the phosphor particles 110, and then, it was heated and dried. Accordingly, the phosphor layer 11 (FIG. 4) was formed, in which the gap between the phosphor particles 110 was embedded with the binder 111. The spraying condition was controlled so that the thickness of the phosphor layer 11 fell within the range from 40 μm to 60 μm at the thickest region, and in the range from 5 μm to 30 μm at the thinnest region. According to the procedure above, eleven samples were prepared.

(Evaluation)

As to each sample, the angular dependence of the chromaticity (chromaticity difference ΔCx), the area ratio of the light leak, the diffuse transmittance, the total light transmittance, the parallel light transmittance, a value subtracted the parallel light transmittance from the diffuse transmittance, and the haze value (Hz) were obtained.

Figure 8A:
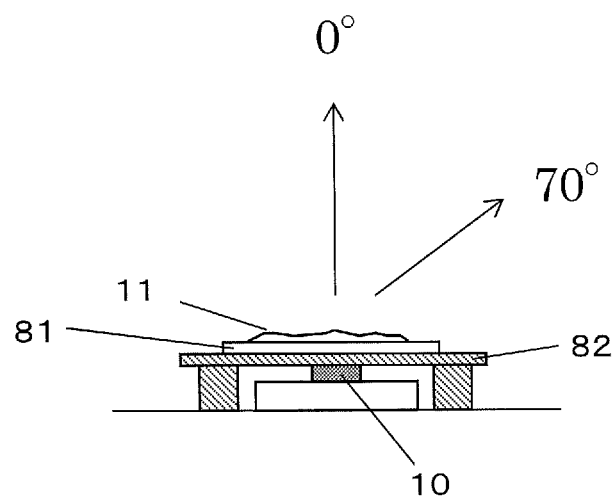
FIG. 8A is a cross section showing the configuration of the evaluation unit used for evaluating a sample in the first example.
Figure 8B:
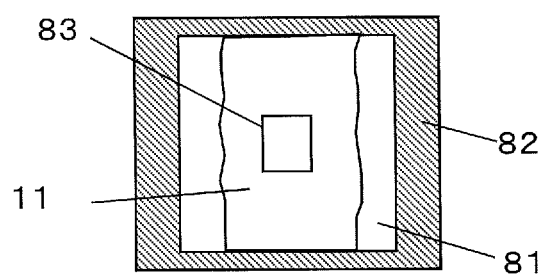
FIG. 8B is a top view thereof.

The angular dependence of the chromaticity and the area ratio of the light leak were measured by using an evaluator, the cross section and the top view thereof being illustrated in FIGS. 8A and 8B. This evaluator has substantially the same positional relations as the light emitting device shown in FIG. 5A, and allows the blue light (446 nm in wavelength) from the light emitting element 10 to enter the phosphor layer 11. It is to be noted that the emission wavelength of the blue light is not limited to this example, and the light in the range from 440 nm to 480 nm is usable. The light emitting element 10 is a metal-bonding type LED that emits blue light, in which an epitaxial layer (GaN system) being a luminous layer is subjected to metal joining with an Si substrate. A sample of the glass plate 81 provided with the phosphor layer 11 is mounted directly on the light emitting element 10, via a fixture 82. The fixture 82 is provided with an opening 83 being the same in size as the size of the top surface of the light emitting element 10 (the top surface of the epitaxial layer), directly on the light emitting element 10. With this configuration, blue light enters the phosphor layer 11 from the light emitting element 10 at an incident angle in substantially the same manner as the light emitting element 10 shown in FIG. 5A. A part of the blue light passes through the region 41 at the gap between the phosphor particles 110 and it is outputted from the upper surface of the phosphor layer 11, as light leak. The phosphor particle 110 irradiated with the blue light converts the blue light into fluorescence, and yellow light is outputted from the upper surface of the phosphor layer 11.

The amount of the phosphor particles 110 in the phosphor layer 11 is set to be a predetermined amount. Therefore, the chromaticity of the light obtained by mixing the blue light and the yellow fluorescence is a predetermined chromaticity in the entire phosphor layer 11 (e.g., within a range of white color based on the SAE standard), but in the microscopic sense, there exists an angle distribution. Under this condition, the chromaticity in the vertical direction on the phosphor layer 11 (azimuth 0°) and the chromaticity at the azimuth 70° with respect to the vertical direction were measured, respectively, and a chromaticity difference ΔCx therebetween was obtained. Table 1 illustrates the chromaticity difference ΔCx of the samples 1 to 11.

TABLE 1

| | Plate Glass | | | | | | |
|---|---|---|---|---|---|---|---|
| NO | Element Area Ratio of Blue-light leak (%) | Hz | Total Light Transmittance (%) | Diffuse Transmittance (%) | Parallel Light Transmittance (%) | Diffuse Transmittance-Parallel Light Transmittance (%) | Angular Dependence of Chromaticity ΔCx |
| 1 | 7.7 | 85.7 | 64.9 | 55.7 | 9.2 | 46.5 | 0.032 |
| 2 | 6.9 | 85.7 | 66.6 | 57.1 | 9.5 | 47.9 | 0.030 |
| 3 | 3.1 | 87.0 | 67.0 | 58.3 | 8.7 | 49.6 | 0.027 |
| 4 | 5.2 | 89.4 | 64.7 | 57.9 | 6.8 | 51.1 | 0.029 |
| 5 | 9.0 | 87.5 | 63.5 | 54.2 | 9.3 | 46.5 | 0.035 |
| 6 | 7.2 | 87.8 | 67.2 | 59.0 | 8.2 | 50.8 | 0.026 |
| 7 | 4.5 | 91.0 | 68.0 | 61.9 | 6.1 | 55.8 | 0.026 |
| 8 | 3.5 | 92.1 | 69.2 | 63.7 | 5.5 | 58.2 | 0.026 |
| 9 | 8.7 | 84.0 | 61.3 | 51.5 | 9.8 | 41.7 | 0.038 |
| 10 | 11.7 | 78.2 | 57.8 | 45.2 | 12.6 | 32.6 | 0.039 |
| 11 | 13.3 | 72.7 | 52.0 | 37.8 | 14.2 | 23.6 | 0.041 |

Next, the phosphor layer 11 was observed through the dark filter from directly above, and the area of the region 41 was measured, from which the blue-color light leak was outputted. Then, the ratio of the area was calculated, being the ratio of the region 41 for the blue-color light leak to the top surface (top surface of the epitaxial layer) of the light emitting element 10. Table 1 shows the result of the calculation.

Meanwhile, the light source (here, a halogen lamp) for outputting visible rays was used and following values were measured by the haze meter, as to the phosphor layer 11 on the glass plate 81; the diffuse transmittance, the parallel light transmittance, the total light transmittance, a value obtained by subtracting the parallel light transmittance from the diffuse transmittance, and the haze value (Hz: haze). The total light transmittance and the diffuse transmittance were measurable by the haze meter. The parallel light transmittance and the haze value were measured according to the following formulas (1) and (2):

$$\text{Parallel light transmittance} = \text{Total light transmittance} - \text{Diffuse transmittance} \quad (1)$$

$$\text{Haze value} = \text{Diffuse transmittance}/\text{Total light transmittance} \times 100\% \quad (2)$$

Table 1 shows the obtained diffuse transmittance, parallel light transmittance, total light transmittance, the value obtained by subtracting the parallel light transmittance from the diffuse transmittance, and the haze value.

Figure 9:
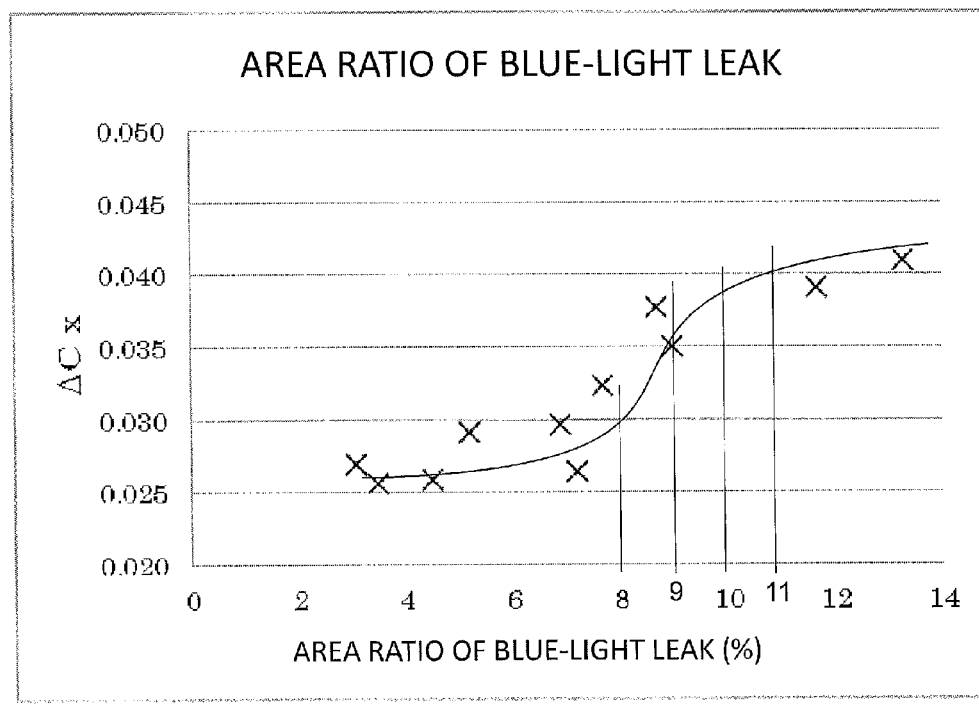
FIG. 9 is a graph showing the relations between the area ratio of the light leak and the chromaticity difference ΔCx, in the phosphor layer formed in the first example.

The graph in FIG. 9 shows the relations between the area ratio of blue-light leak in Table 1 and the chromaticity difference ΔCx. As apparent from the graph in FIG. 9, it is found that there is an obvious correlation between the area ratio of the blue-light leak (region 41) and the chromaticity difference ΔCx, and it is possible to provide a light emitting device having a small chromaticity difference ΔCx, by controlling the area ratio of the blue-light leak (region 41). Specifically, since the range of the chromaticity difference ΔCx≤0.4 is usable as the light source of the head lamp, the area ratio of the blue-light leak of 11% or less allows the usage. However, there is criticality in the relations between the area ratio of the blue-light leak (region 41) and the chromaticity difference ΔCx, and by setting the area ratio of the blue-light leak (region 41) to be 10% or less, it is possible to reduce the chromaticity difference ΔCx drastically. In particular, it is preferable to set the area ratio of the blue-light leak (region 41) to be 9% or less, because the chromaticity difference ΔCx may be reduced considerably. Furthermore, by setting the area ratio of the blue-light leak (region 41) to be 8% or less, the chromaticity difference ΔCx is improved by nearly 40%, relative to the case where the area ratio is more than 10%. In addition, even though the area ratio is changed within the range of 8% or less, the value of ΔCx is stable, and this provides a light emitting device being suitable for volume production.

Figure 10:
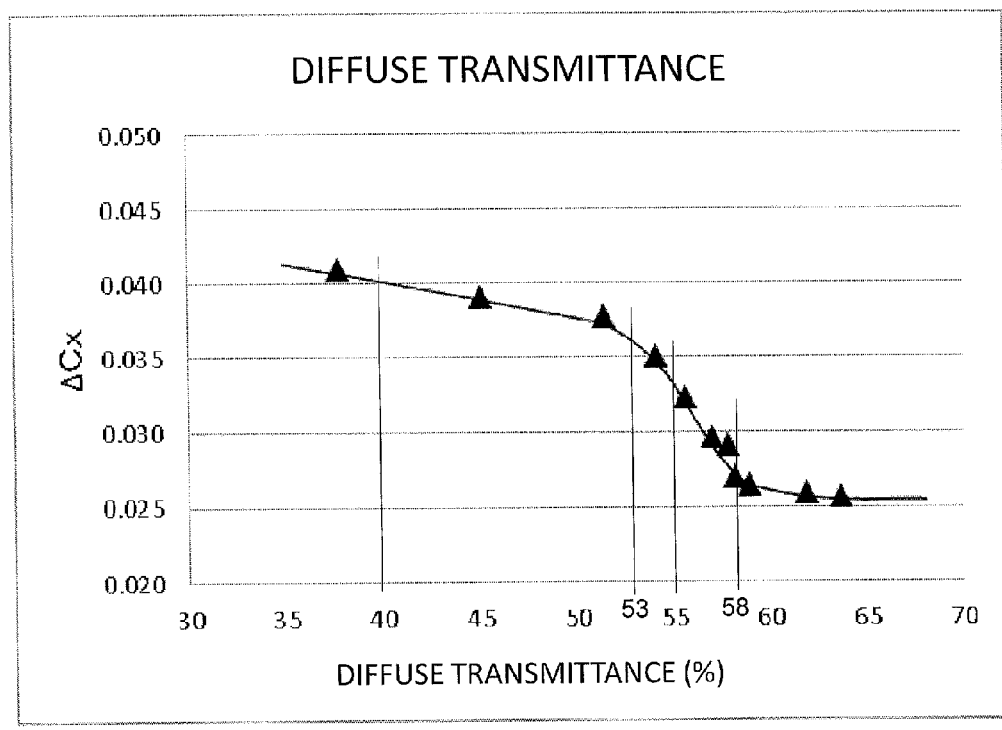
FIG. 10 is a graph showing the relations between the diffuse transmittance and the chromaticity difference ΔCx, in the phosphor layer formed in the first example.

Next, FIG. 10 illustrates the relations between the diffuse transmittance and the chromaticity difference ΔCx. As shown in FIG. 10, there is an obvious correlation between the diffuse transmittance and the chromaticity difference ΔCx, and criticality is also indicated. Accordingly, it is found that by controlling the diffuse transmittance, it is possible to provide a light emitting device having a small chromaticity difference ΔCx. Specifically, since the range of the chromaticity difference ΔCx≤0.4 is usable as the light source of the head lamp, the diffuse transmittance 40% or more allows the usage. However, by setting the diffuse transmittance to be 53% or more, it is possible to reduce the chromaticity difference ΔCx drastically. In particular, it is preferable to set the diffuse transmittance to be 55% or more, because the chromaticity difference ΔCx may be reduced considerably. Furthermore, by setting the diffuse transmittance to be 55% or more, the chromaticity difference ΔCx is improved by nearly 40%, relative to the case where the diffuse transmittance is less than 40%. In addition, in the range where the diffuse transmittance is 58% or more, the value of ΔCx is stable, and this provides a light emitting device being suitable for volume production.

Figure 11:
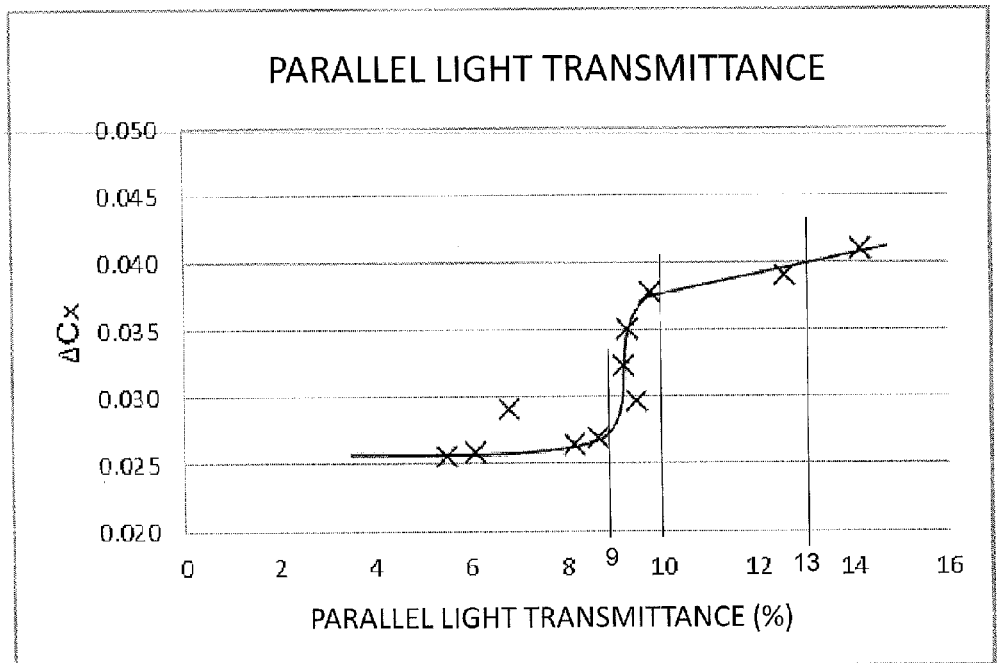
FIG. 11 is a graph showing the relations between the parallel light transmittance and the chromaticity difference ΔCx, in the phosphor layer formed in the first example.

FIG. 11 illustrates the relations between the parallel light transmittance and the chromaticity difference ΔCx. As shown in FIG. 11, there is an obvious correlation between the parallel light transmittance and the chromaticity difference ΔCx, and there is also criticality. The range of the parallel light transmittance of 13% or less, corresponding to the chromaticity difference ΔCx≤0.4, is usable as the light source of the head lamp. However, by setting the parallel light transmittance to be 10% or less, it is possible to reduce the chromaticity difference ΔCx drastically. In particular, by setting the parallel light transmittance to be 9% or less, the chromaticity difference ΔCx is improved considerably, relative to the case where the parallel light transmittance is more than 13%, and the value of ΔCx is stabilized. Therefore, this is suitable for volume production.

Figure 12:
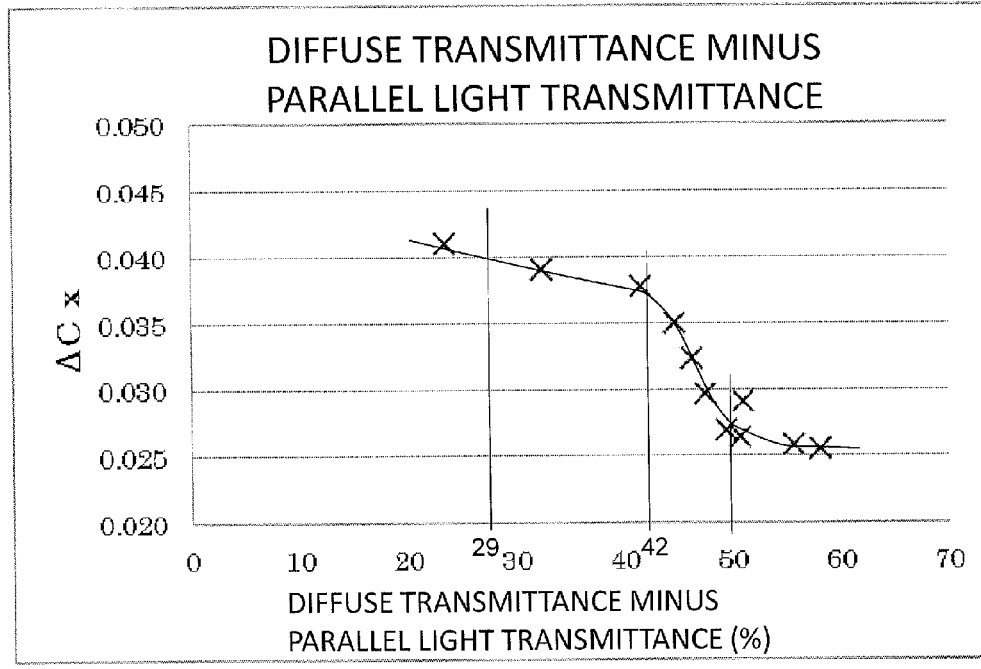
FIG. 12 is a graph showing the relations between a difference in transmittance between the diffuse transmittance and the parallel light transmittance, and the chromaticity difference ΔCx, in the phosphor layer formed in the first example.

FIG. 12 illustrates the relations between the difference between the diffuse transmittance and the parallel light transmittance (hereinafter, referred to as "diffuse transmittance minus parallel light transmittance") and the chromaticity difference ΔCx. As shown in FIG. 12, there is an obvious correlation between the "diffuse transmittance minus parallel light transmittance" and the chromaticity difference ΔCx, and there is also criticality. The range of the "diffuse transmittance minus parallel light transmittance" of 29% or more, corresponding to the chromaticity difference ΔCx≤0.4, is usable as a light source of the head lamp. However, by setting the parallel light transmittance to be 42% or more, it is possible to reduce the chromaticity difference ΔCx drastically. In particular, by setting the "diffuse transmittance minus parallel light transmittance" to be 50% or more, the chromaticity difference ΔCx is improved considerably, relative to the case where the "diffuse transmittance minus parallel light transmittance" is less than 29%, and the value of ΔCx is stabilized. Therefore, this is suitable for volume production.

Figure 13:
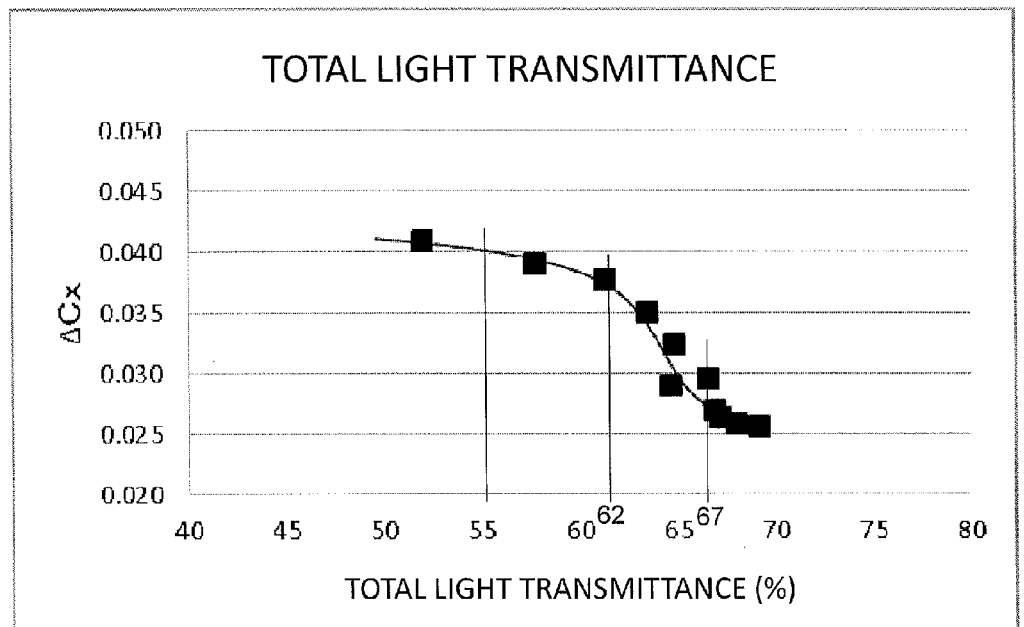
FIG. 13 is a graph showing the relations between the total light transmittance and the chromaticity difference ΔCx, in the phosphor layer formed in the first example.

FIG. 13 illustrates the relations between the total light transmittance and the chromaticity difference ΔCx. As shown in FIG. 13, there is an obvious correlation between the total light transmittance and the chromaticity difference ΔCx. As the total light transmittance was increased, the chromaticity difference ΔCx was improved more. The range of the total light transmittance of 55% or more, corresponding to the chromaticity difference ΔCx≤0.4, is usable as the light source of the head lamp. However, by setting the total light transmittance to be 62% or more, it is possible to reduce the chromaticity difference ΔCx drastically. In particular, by setting the total light transmittance to be 67% or more, the chromaticity difference ΔCx is improved considerably, relative to the case where the total light transmittance is less than 55%.

Figure 14:
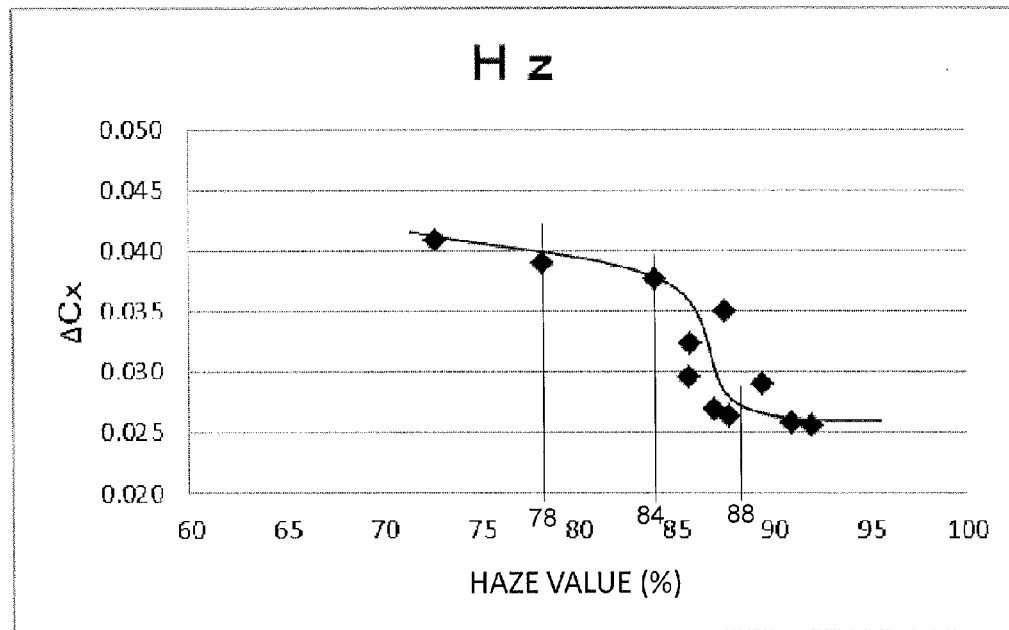
FIG. 14 is a graph showing the relations between a haze value and the chromaticity difference ΔCx in the phosphor layer formed in the first example.

FIG. 14 illustrates the relations between the haze value and the chromaticity difference ΔCx. As shown in FIG. 14, there is an obvious correlation between the haze value and the chromaticity difference ΔCx, and there is also criticality. The range of the haze value of 78% or more, corresponding to the chromaticity difference ΔCx≤0.4, is usable as the light source of the head lamp. However, by setting the haze value to be 84% or more, it is possible to reduce the chromaticity difference ΔCx drastically. In particular, by setting the haze value to be 88% or more, the chromaticity difference ΔCx is improved considerably, relative to the case where the haze value is less than 78%, and the value of ΔCx is stabilized. Therefore, this is suitable for volume production.

According to the present embodiment as described above, it has been figured out that the spraying condition is controlled so that at least one of the following values falls into a predetermined range; the area ratio of the light leak, the diffuse transmittance, the total light transmittance, the parallel light transmittance, the "diffuse transmittance minus parallel light transmittance", and the haze (Hz) value, thereby providing the light emitting device that is small in angular dependence of the chromaticity.

In addition, the surface roughness Ra of the phosphor layer 11 of each sample was measured, and the surface roughness was different, between the sample where the parallel light transmittance and the area ratio of the blue-light leak were 10% or less, and the sample where those values were more than 10%. In the sample where the parallel light transmittance and the area ratio of the blue-light leak were 10% or less, the surface roughness Ra was in the range from 4 μm to 12 μm. This value corresponds to an average particle diameter of the phosphor particle 111. In addition, in the sample where the parallel light transmittance and the area ratio of the blue-light leak were small, the surface roughness Ra was in the range from 4 μm to 8 μm. This value corresponds to a half of the particle diameter of the phosphor particle 111.

Second Example

Figure 15:
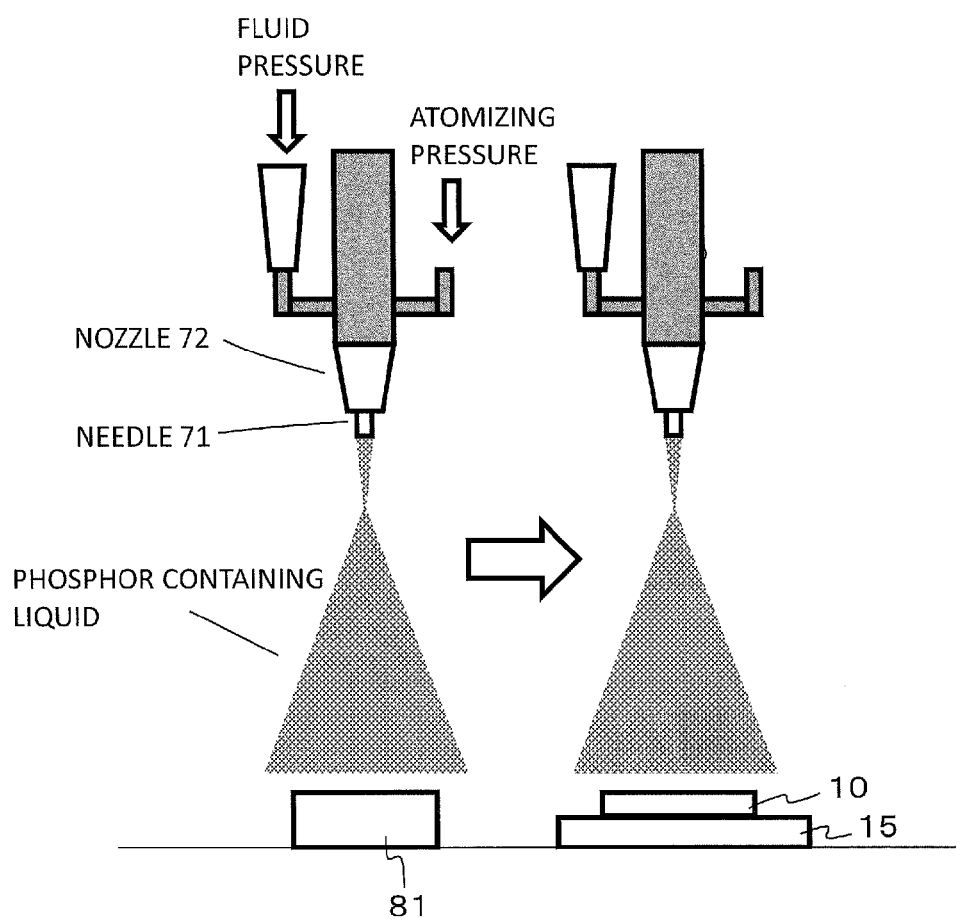
FIG. 15 illustrates a step of forming the phosphor layer in the second example.

A production method for directly spraying the phosphor particles 110 onto the top surface of the light emitting element 10 according to the spray coating method and forming the phosphor layer 11 will be explained as the second example. The spray coating method is similar to the first example. However, as shown in FIG. 15, the glass plate 81 is placed next to the light emitting element 10 to be coated. The phosphor layer 11 is formed on the glass plate 81, firstly, and then, the diffuse transmittance, or the like, of thus formed phosphor layer 11 is measured. If the diffuse transmittance, or the like, falls into an adequate range, the phosphor layer 11 is formed on the top surface of the adjacent light emitting element 10 under the same spraying condition without change.

Figures 16A, 16B:
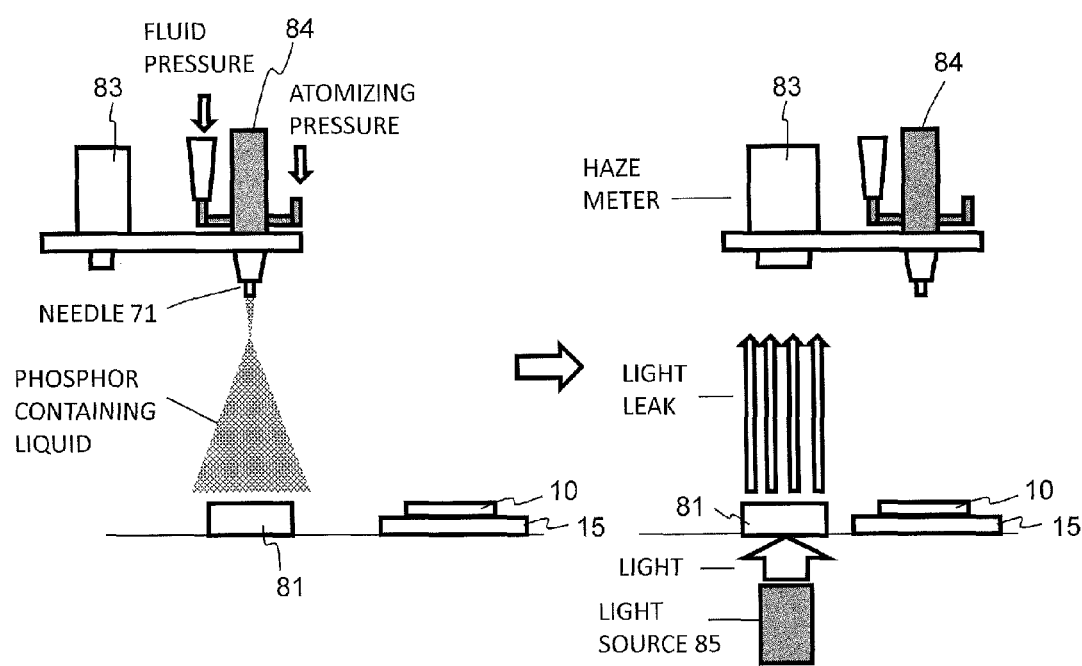
FIG. 16A and FIG. 16B illustrate steps of forming the phosphor layer, by the spray unit being provided with a haze meter of the second example.

Specifically, by using the system as illustrated in FIG. 16A and FIG. 16B, for example, it is possible to obtain in real time at least one of the area ratio of the light leak, the diffuse transmittance, the total light transmittance, the parallel light transmittance, the "diffuse transmittance minus parallel light transmittance", and the haze (Hz) value, and to form the phosphor layer 11 on the light emitting element 10 under an adequate spraying condition. In the system as shown in FIG. 16A and FIG. 16B, the haze meter 83 is arranged next to the spray unit 84. The distance between the spray unit 84 and the haze meter 83 is set to be equal to the distance between the light emitting element 10 on which the phosphor layer 11 is to be formed, and the glass plate 81 to be arranged next thereto. Furthermore, a white-color light source 85 is placed under the glass plate 81.

With the use of this system, firstly, spray liquid containing the phosphor is sprayed from the spray unit 84 onto the glass plate 81, thereby forming the phosphor layer 11. Next, the spray unit 84 is moved to the position above the light emitting element 10, and the haze meter 83 is moved to the position above the glass plate 81. The phosphor layer 11 on the glass plate 81 is irradiated with white-color light from the white-color light source 85. Then, the light is measured by the haze meter 83, so as to obtain the diffuse transmittance, the parallel light transmittance, the total light transmittance, the "diffuse transmittance minus parallel light transmittance", and the haze value. If any of those numerical values falls into the adequate range as explained in the first example, the spray liquid containing the phosphor is sprayed from the spray unit 84 onto the top surface of the light emitting element 10, thereby forming the phosphor layer 11.

As discussed above, in the examples of the present invention, the diffuse transmittance of the phosphor layer 11 is controlled so as to control the angular dependence of the chromaticity. Therefore, even though the light scattering agent is not contained, angular dependence of the chromaticity is reduced in the phosphor layer 11, thereby providing the light emitting device with high brightness.

It is to be noted here that in the aforementioned embodiment and examples, the spray coating method has been explained. In addition to this method, the structure of the present invention is applicable in a producing method for forming the phosphor layer by splashing a phosphor, that is, a jet dispenser method, for instance. For that case, a needle diameter is set to be the range from Φ100 μm to Φ300 μm so as to perform fine coating, thereby forming the phosphor layer 11 that is superior in film quality.

What is claimed is:

1. A light emitting device comprising a light emitting element and a phosphor layer placed on a top surface of the light emitting element, the light emitting device being configured to convert a part of light outputted from the top surface of the light emitting element into a fluorescence and mix the light passing through the phosphor layer with the fluorescence and output the light with predetermined chromaticity, wherein, the phosphor layer contains phosphor particles laid along the top surface of the light emitting element, and a binder filled into a gap between the phosphor particles, and an area of a region being positioned at the gap between the phosphor particles is between or equal to 3% and 10% with respect to the area of an upper surface of the phosphor layer, the region allowing the light being outputted to pass through the binder and directly reach the upper surface of the phosphor layer.

2. The light emitting device according to claim 1, wherein, surface roughness Ra of the phosphor layer is equal to or less than an average particle diameter of the phosphor layer.

3. The light emitting device according to either of claim 1, wherein, a film thickness of the phosphor layer is equal to or less than threefold of the average particle diameter of the phosphor particle.

4. The light emitting device according to claims 1, wherein, the average particle diameter of the phosphor particle is between or equal to 10 μm and 20 μm.

5. The light emitting device according to claims 1, wherein, an adhesion layer is placed between the phosphor layer and the top surface of the light emitting element, and a plate-like member is mounted on the upper surface of the phosphor layer that is transparent to the light outputted from the light emitting element and the fluorescence.

* * * * *